United States Patent
Tallant, II

(10) Patent No.: US 6,879,189 B2
(45) Date of Patent: Apr. 12, 2005

(54) ASYNCHRONOUS FAULT DETECTION CIRCUIT FOR A PWM DRIVER

(75) Inventor: James C. Tallant, II, Carmel, IN (US)

(73) Assignee: Delphi Technologies, Inc., Troy, MI (US)

(*) Notice: Subject to any disclaimer, the term of this patent is extended or adjusted under 35 U.S.C. 154(b) by 59 days.

(21) Appl. No.: 10/401,855

(22) Filed: Mar. 28, 2003

(65) Prior Publication Data

US 2004/0189348 A1 Sep. 30, 2004

(51) Int. Cl.[7] .................................................. H03K 3/00
(52) U.S. Cl. ............................ 327/108; 327/20; 327/352
(58) Field of Search ............................ 327/108–112, 20, 327/352; 361/56, 91

(56) References Cited

U.S. PATENT DOCUMENTS 5,164,659 A * 11/1992 Schultz et al. ............... 323/351
6,317,458 B1 * 11/2001 Boggs et al. ................. 375/238

* cited by examiner

Primary Examiner—Kenneth B. Wells
(74) Attorney, Agent, or Firm—Stefan V. Chmielewski

(57) ABSTRACT

Fault detection circuitry is provided for a PWM driver responsive to a PWM input signal to produce a PWM output signal, and includes a first circuit producing a scaled switching signal as a scaled representation of the PWM input signal. A second circuit is configured to produce a combined switching signal as a combination of the PWM output signal and the scaled switching signal, and a third circuit is configured to convert the combined switching signal to an analog output signal indicative of one or more fault conditions associated with the PWM driver. A number of comparators may be included with each responsive to the analog output signal and to a different one of a corresponding number of different references voltages, to produce a fault signal indicative of a particular one of the one or more fault conditions.

19 Claims, 5 Drawing Sheets

ASYNCHRONOUS FAULT DETECTION CIRCUIT FOR A PWM DRIVER

TECHNICAL FIELD

The present invention relates generally to fault detection circuitry, and more specifically to such circuitry for determining fault conditions associated with conventional PWM drivers.

BACKGROUND OF THE INVENTION

Due to the nature of pulse-width modulated (PWM) signals, certain faults associated with PWM driver circuits may typically be detected during the "on" portion of the duty cycle, while others may be detected during the "off" portion of the duty cycle. However, few PWM driver fault conditions are detected during both portions of the duty cycle. Heretofore, fault detection circuits for PWM drivers have therefore typically employed synchronous detection schemes requiring complicated timing circuits operable to quickly determine the state of the PWM driver output signal relative to the PWM input signal so that fault detection may be accomplished during an appropriate portion of the duty cycle. It is desirable to avoid such synchronous fault detection schemes and complicated timing circuitry required thereby, and provide for asynchronous fault detection for PWM drivers using relatively simpler fault detection circuitry.

SUMMARY OF THE INVENTION

The present invention comprises one or more of the following features or combinations thereof. Fault detection circuitry for a PWM driver responsive to a PWM input signal to produce a PWM output signal may include a first circuit configured to produce a scaled switching signal as a scaled representation of the PWM input signal, a second circuit configured to produce a combined switching signal as a combination of the PWM output signal and the scaled switching signal, and a third circuit configured to convert the combined switching signal to an analog output signal indicative of one or more fault conditions associated with the PWM driver. The third circuit may be a low pass filter circuit, and the low pass filter circuit may be a second-order low pass filter circuit.

The fault detection circuitry may further include a first comparator circuit receiving the analog output signal and producing a first fault signal if the analog output signal exceeds a first reference signal. The first fault signal may indicate a first fault condition wherein the PWM output signal is shorted to a supply voltage of the PWM driver.

The fault detection circuitry may alternatively or additionally include a second comparator circuit receiving the analog output signal and producing a second fault signal if the analog output signal drops below a second reference signal. The second fault signal may indicate a second fault condition wherein the PWM output signal is shorted to a reference potential of the PWM driver.

The second circuit may include a first limiter circuit configured to receive the PWM output signal and produce a first limited switching signal that limits a high level of the PWM output signal to a predefined high signal level and that limits a low level of the PWM output signal to a predefined low signal level, and a second limiter circuit receiving the scaled switching signal and producing a second limited switching signal that limits a high level of the scaled switching signal to the predefined high signal level and that limits a low level of the scaled switching signal to the predefined low signal level. In this embodiment, the high level of the PWM signal and the high level of the scaled switching signal are each greater than or equal to the predefined high signal level, and the low level of the PWM signal and the low level of the scaled switching signal are each less than or equal to the predefined low signal level.

The PWM driver may be an inverting driver such that the PWM output signal is an inverted representation of the PWM input signal. The first circuit may be a non-inverting amplifier receiving the PWM input signal and producing the scaled switching signal as a scaled and non-inverted representation of the PWM input signal, and in this embodiment the second circuit may include a summing circuit producing a summed switching signal as a sum of the first limited switching signal and the second limited switching signal, and a normalizing circuit producing the combined switching signal as a difference between the summed switching signal and a sum of the predefined high and low signal levels. Alternatively, the first circuit may be an inverting amplifier receiving the PWM input signal and producing the scaled switching signal as a scaled and inverted representation of the PWM input signal, and in this embodiment the second circuit may include a difference circuit producing the combined switching signal as a difference between the first limited switching signal and the second limited switching signal.

The PWM driver may alternatively be a non-inverting driver such that the PWM output signal is a non-inverted representation of the PWM input signal. The first circuit may be an inverting amplifier receiving the PWM input signal and producing the scaled switching signal as a scaled and inverted representation of the PWM input signal, and in this embodiment the second circuit may include a summing circuit producing a summed switching signal as a sum of the first limited switching signal and the second limited switching signal, and a normalizing circuit producing the combined switching signal as a difference between the summed switching signal and a sum of the predefined high and low signal levels. Alternatively, the first circuit may be a non-inverting amplifier receiving the PWM input signal and producing the scaled switching signal as a scaled and non-inverted representation of the PWM input signal, and in this embodiment the second circuit may include a difference circuit producing the combined switching signal as a difference between the first limited switching signal and the second limited switching signal.

These and other features of the present invention will become more apparent from the following description of the illustrative embodiments.

DESCRIPTION OF THE ILLUSTRATIVE EMBODIMENTS

Figure 1:
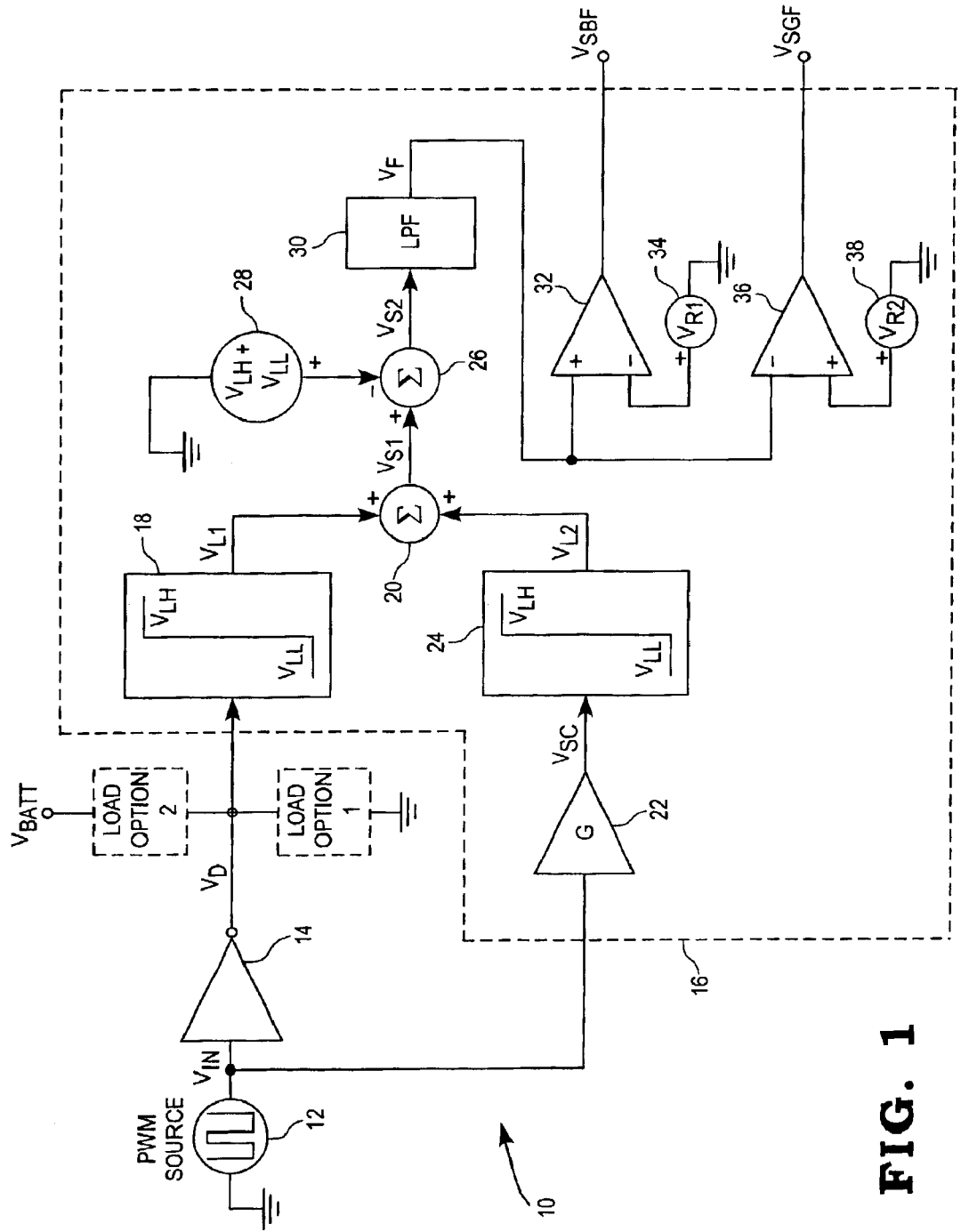
FIG. 1 is a schematic diagram of a PWM driver circuit including one embodiment of an asynchronous fault detection circuit configured to detect faults associated with a conventional PWM driver.
Figure 2:
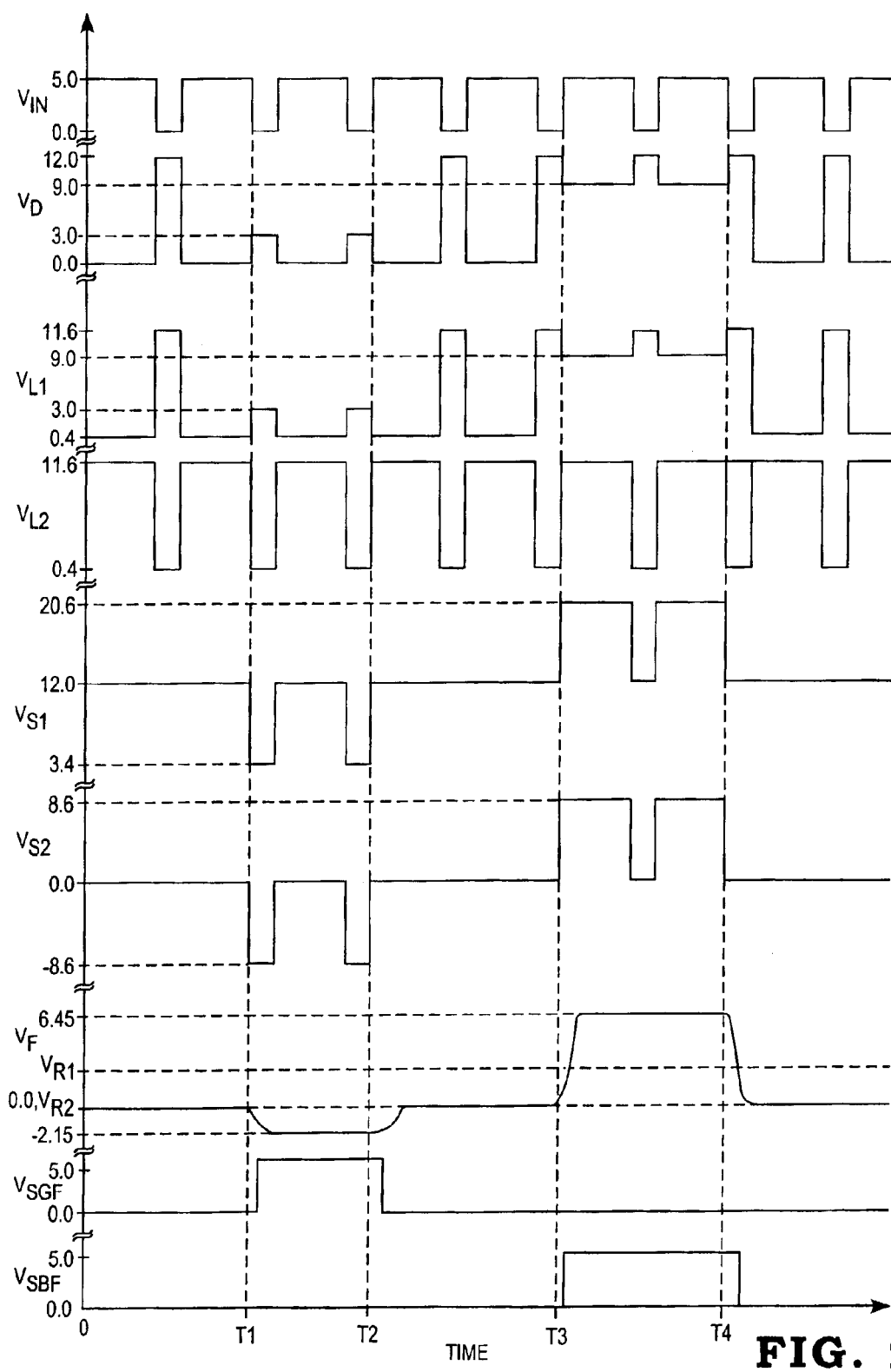
FIG. 2 is a plot of various voltage signals associated with the circuitry of FIG. 1 vs. time illustrating operation of the asynchronous fault detection circuit.

Referring now to FIG. 1, a schematic diagram is shown illustrating one embodiment of a PWM driver circuit 10 including an asynchronous fault detection circuit 16 for detecting faults associated with a conventional PWM driver 14. In the embodiment illustrated in FIG. 1, the PWM driver 14 is an inverting driver having an input connected to a PWM signal source 12 producing a pulse-width modulated (PWM) signal, $V_{IN}$. The PWM signal, $V_{IN}$, produced by source 12 defines a duty cycle, wherein the term "duty cycle" is defined for purposes of this document as a percentage of time that the PWM signal, $V_{IN}$, is in a logical high state as compared with the total period of the PWM signal, $V_{IN}$, or similar definition. The PWM signal source 12 may typically be a control circuit producing a logic-level PWM signal, $V_{IN}$, although it is contemplated that the PWM signal source 12 may alternatively represent any known PWM signal source. The logical high and low values produced by the PWM signal source 12 may switch between any desired voltage levels, and an example of a typical PWM signal, $V_{IN}$, produced by the PWM signal source 12 nominally switches between 0–5 volts. The inverting PWM driver 14 receives the PWM input signal, $V_{IN}$, and produces an inverted PWM output voltage, $V_D$, that switches between a voltage supply or rail; e.g., battery voltage, or $V_{BATT}$, and a reference potential; e.g., ground potential. Example voltage waveforms of the PWM driver circuit 10 are illustrated in FIG. 2, and the illustrated example PWM input signal, $V_{IN}$, switches between 0–5 volts and has a duty cycle of approximately 75%. The PWM output signal, $V_D$, at least between the time interval 0–T1, is an inverted representation of $V_{IN}$ that switches nominally between 0–12 volts.

The PWM driver 14 may be configured to drive any of a number of load configurations, wherein two such load configurations are illustrated in phantom in FIG. 1. Load option 1 represents one example load configuration wherein the load is connected between the output of the PWM driver 14 and ground (or other reference) potential. In this embodiment, the PWM driver 14 may be configured as a conventional high-side driver operable to source current from the PWM driver voltage supply to the load. Load option 2 represents another example load configuration wherein the load is connected between the output of the PWM driver 14 and a suitable voltage supply; e.g., $V_{BATT}$. In this embodiment, the PWM driver 14 may be configured as a conventional low-side driver operable to sink current flowing through the load from the voltage supply, $V_{BATT}$. Alternatively, the PWM driver 14 may be configured with either load option as a conventional push-pull driver operable to source or sink current to/from the load. Those skilled in the art will recognize other load driving configurations of the PWM driver 14, and any such other load driving configurations are intended to fall within the scope of the present invention.

The PWM output voltage, $V_D$, produced by the PWM driver 14 is supplied to an input of a first signal limiter circuit 18 forming part of the asynchronous fault detection circuit 16. The signal limiter circuit 18 is configured to produce a first limited switching signal, $V_{L1}$, that limits the high voltage level of the PWM output voltage, $V_D$, to a predefined high voltage level, $V_{LH}$, and that limits the low voltage level of the PWM output voltage, $V_D$, to a predefined low voltage level, $V_{LL}$. Generally, the high voltage level of the PWM output voltage, $V_D$, is greater than or equal to the predefined high voltage level, $V_{LH}$, and the low voltage level of the PWM output voltage, $V_D$, is less than or equal to the predefined low voltage level, $V_{LL}$. It is desirable to set $V_{LH}$ at a voltage level representing the lowest high-level PWM output voltage, $V_D$, under normal PWM driver 14 operating conditions (i.e., non-fault conditions), and to set $V_{LL}$ at a voltage level representing the highest low-level PWM output voltage, $V_D$, under normal PWM driver 14 operating conditions. This results in a first limited switching signal, $V_{L1}$, that switches between $V_{LL}$ and $V_{LH}$ under PWM driver 14 non-fault conditions, regardless of any variations in the upper and lower saturation voltage levels of the PWM output voltage, $V_D$. Referring again to FIG. 2, $V_{LL}$ is set at 0.4 volts and $V_{LH}$ is set at 11.6 volts in this example where the PWM output voltage, $V_D$, switches nominally between 0–12 volts. The first limited switching signal waveform, $V_{L1}$, accordingly represents a non-inverted representation of $V_D$ switching, at least during the time interval 0–T1, between 0.4 and 11.6 volts.

Referring again to FIG. 1, the asynchronous fault detection circuit 16 further includes a scaling circuit 22 receiving the PWM input signal, $V_{IN}$, and producing a scaled switching signal, $V_{SC}$, that is a scaled representation of $V_{IN}$. The scaling circuit 22 has a gain, G, which may be selected to scale the PWM input voltage, $V_{IN}$, as desired. Referring to FIG. 2, the gain, G, of the scaling circuit 22 is selected in this example such that the scaled switching signal, $V_{SC}$, switches nominally between 0–12 volts. Referring again to FIG. 1, the output of the scaling circuit 22 is connected to an input of a second signal limiter circuit 24 forming part of the asynchronous fault detection circuit 16. The second signal limiter circuit 24 is configured identically as the first limiter circuit 18 to produce a second limited switching signal, $V_{L2}$, that limits the high voltage level of the scaled switching signal, $V_{SC}$, produced by the scaling circuit 22 to the predefined high voltage level, $V_{LH}$, and that limits the low voltage level of the scaled switching signal, $V_{SC}$, to the predefined low voltage level, $V_{LL}$. Generally, the high voltage level of the scaled switching signal, $V_{SC}$, is greater than or equal to the predefined high voltage level, $V_{LH}$, and the low voltage level of the scaled switching signal, $V_{SC}$, is less than or equal to the predefined low voltage level, $V_{LL}$. The gain, G, of the scaling circuit 22 is thus typically selected to suitably scale the PWM input voltage, $V_{IN}$, so that the high and low voltage levels of the second limited switching signal, $V_{SC}$, satisfy these criteria. Referring again to FIG. 2, $V_{LL}$ is set at 0.4 volts and $V_{LH}$ is set at 11.6 volts in this example where the scaled switching signal, $V_{SC}$, produced by the scaling circuit switches nominally between 0–12 volts. The second limited switching signal waveform, $V_{L2}$, accordingly represents a non-inverted and scaled representation of the PWM input voltage $V_{IN}$ switching, at least during the time interval 0–T1, between 0.4 and 11.6 volts.

Referring again to FIG. 1, the asynchronous fault detection circuit 16 further includes a summing circuit 20 configured to sum the first and second limited switching signals $V_{L1}$ and $V_{L2}$ produced by the first and second signal limiter circuits 18 and 24 respectively, and produce a summed switching signal, $V_{S1}$, as a sum thereof. Under non-fault PWM driver 14 conditions, the resulting summed switching signal, $V_{S1}$, will thus be a constant voltage level having amplitude of $V_{LL}+V_{LH}$. In the example voltage waveforms of FIG. 2 during the time interval 0–T1, the summed switching signal, $V_{S1}$, is accordingly a constant 12.0 volts. Since the amplitude of $V_{S1}$ under normal PWM driver 14 operating conditions will always be $V_{LL}+V_{LH}$, this amplitude represents a constant offset value that may be normalized. Referring again to FIG. 1, the asynchronous fault detection circuit 16 may therefore include a normalizing circuit 26 configured to receive the summed switching signal, $V_{S1}$, and produce a combined switching signal, $V_{S2}$, that is representative of the summed switching signal, $V_{S1}$, normalized to a convenient reference value. In the illustrated embodiment, the normalizing circuit 26 is a subtraction circuit subtracting the offset voltage, $V_{LL}+V_{LH}$, supplied by voltage source 28, from the summed switching signal, $V_{S1}$, to thereby produce the combined switching signal, $V_{S2}$, that is referenced to 0.0 volts under PWM driver 14 non-fault conditions as illustrated in FIG. 2 during the time interval 0–T1.

The output of the subtraction circuit 26 is connected to an input of a filter circuit 30 configured to receive the combined switching signal, $V_{S2}$, and produce an analog output signal, $V_F$, that varies as a filtered function of the combined switching signal, $V_{S2}$. In the illustrated embodiment, the filter circuit 30 is a conventional second-order low pass filter circuit, although other configurations of the filter circuit 30 are contemplated. Under non-fault PWM driver 14 conditions, the analog output signal, $V_F$, in the example signal waveforms of FIG. 2 during the time interval 0–T1, is a constant 0.0 volts.

The configuration of the asynchronous fault detection circuit 16 described thus far produces an analog output signal, $V_F$, that is an analog representation of the combination of the PWM output signal, $V_D$, and the scaled switching signal, $V_{SC}$, limited by the first and second limiter circuits 18 and 24 respectively, and combined via the summing circuit 20 and the normalizing circuit 26, 28. Thus, if the PWM output voltage, $V_D$, produced by the PWM driver 14 deviates above the lower voltage limit value, $V_{LL}$, or below the upper voltage limit value, $V_{LH}$, the amount of this deviation will be reflected in the analog output signal, $V_F$. The asynchronous fault detection circuit 16 illustrated in FIG. 1 is accordingly capable of discriminating between any number of fault conditions associated with the PWM driver 14 that are manifested in the PWM output signal, $V_D$. The asynchronous fault detection circuit 16 may therefore include any number of comparators configured to compare the analog output signal, $V_F$, to any corresponding number of different reference voltage levels to thereby produce any corresponding number of fault signals indicative of any corresponding number of faults associated with the operation of the PWM driver 14 that are manifested in the PWM output signal, $V_D$. In the illustrated example, two such comparators 32 and 36 are provided for detecting two different fault conditions associated with the PWM driver 14, although it will be understood that the asynchronous fault detection circuit 16 may alternatively include more or fewer comparator circuits configured to discriminate any number of fault conditions associated with the operation of the PWM driver 14. In the illustrated embodiment, comparator 32 has a non-inverting input connected to the output of the filter circuit 30, an inverting input connected to a voltage source 34 producing a first reference voltage, $V_{R1}$, and an output producing a short-to-battery fault signal, $V_{SBF}$. As will be described in greater detail hereinafter, the first reference voltage, $V_{R1}$, is selected relative to the analog output signal, $V_F$, so that $V_{SBF}$ is held by comparator 32 at a low level unless and until the low voltage level of the PWM output signal, $V_D$, produced by the PWM driver 14 rises above a predefined voltage threshold indicative of a fault condition wherein the output of the PWM driver 14 is shorted to the voltage source of the PWM driver 14; e.g., $V_{BATT}$.

Comparator 36 has an inverting input connected to the output of the filter circuit 30, a non-inverting input connected to a voltage source 38 producing a second reference voltage, $V_{R2}$, and an output producing a short-to-ground fault signal, $V_{SGF}$. As will be described in greater detail hereinafter, the second reference voltage, $V_{R2}$, is selected relative to the analog output signal, $V_F$, so that $V_{SGF}$ is held by comparator 36 at a low level unless and until the high voltage level of the PWM output signal, $V_D$, produced by the PWM driver 14 decreases below a predefined voltage threshold indicative of a fault condition wherein the output of the PWM driver 14 is shorted to the reference voltage of the PWM driver 14; e.g., ground potential.

Operation of the PWM driver circuit 10 was described hereinabove with the aid of FIG. 2 under normal PWM driver 14 operating conditions (non-fault conditions). With the continued aid of FIG. 2, operation of the asynchronous fault detection circuit 16 illustrated in FIG. 1 will now be described as it relates to two separate and distinct PWM driver 14 fault conditions; namely a PWM driver 14 output short to ground and a PWM driver 14 output short to battery voltage, $V_{BATT}$. A PWM driver 14 output short to ground condition occurs when the high-level PWM output signal, $V_D$, fails to pull up completely to the supply voltage value, $V_{BATT}$, as illustrated during the time interval T1–T2. In the example, the high level of the PWM output signal, $V_D$, pulls up only to 3.0 volts in this interval which causes the high level of the first limited switching signal, $V_{L1}$, produced by the first limiter circuit 18 to likewise pull up only to 3.0 volts while the low level of $V_{L1}$ continues to pull down to $V_{LL}$; e.g., 0.4 volts. Meanwhile, the second limited switching signal, $V_{L2}$, produced by the second limiter circuit 24 switches between the upper and lower voltage levels, $V_{LH}$ and $V_{LL}$ respectively, as would be expected by the first limiter circuit 18 under normal operating conditions. The summed switching signal, $V_{S1}$, and the combined switching signal, $V_{S2}$, produced by the summing and subtraction circuits 20 and 26 respectively, as well as the analog output signal, $V_F$, produced by the filter circuit 30, all reflect voltage signals during this time interval having amplitudes indicative of the severity of the fault condition associated with the PWM driver 14. In the illustrated embodiment, the value of the second reference voltage, $V_{R2}$, is set near 0.0 volts so that when the analog output signal, $V_F$, drops sufficiently below $V_{R2}$ (and ultimately to –2.15 volts as illustrated in FIG. 2) as a result of the short-to-ground fault condition associated with the PWM driver 14, comparator 36 switches states and produces a high level output voltage at $V_{SGF}$. After time T2, the fault is cleared and the PWM output voltage, $V_D$, resumes normal operation as illustrated in FIG. 2. This propagates through the various switching signals $V_{L1}$, $V_{S1}$, $V_{S2}$ and the analog output signal, $V_F$, accordingly returns to its non-fault state shortly after T2. When this occurs, comparator 36 again switches states and produces a low level output voltage at $V_{SGF}$. From time interval T2–T3, the PWM driver 14 does not exhibit any fault conditions, and the fault detection circuitry 16 behaves as described hereinabove under such conditions.

A PWM driver 14 output short to $V_{BATT}$ condition occurs when the low level of the PWM output signal, $V_D$, fails to pull down completely to the PWM driver 14 reference potential (e.g., ground) as illustrated in FIG. 2 during the time interval T3–T4. In the illustrated example, the low level of the PWM output signal, $V_D$, pulls down only to 9.0 volts during this interval which causes the low level of the first limited switching signal, $V_{L1}$, produced by the first limiter circuit 18 to likewise pull down only to 9.0 volts while the high level of $V_{L1}$ continues to pull up to $V_{LH}$; e.g., 11.6 volts. Meanwhile, the second limited switching signal, $V_{L2}$, produced by the second limiter circuit 24 switches between the upper and lower voltage levels, $V_{LH}$ and $V_{LL}$ respectively, as would be expected of the first limiter circuit 18 under normal operating conditions. The summed switching signal, $V_{S1}$, and the combined switching signal $V_{S2}$, produced by the summing and subtraction circuits 20 and 26 respectively, as well as the analog output signal, $V_F$, produced by the filter circuit 30, all reflect voltage signals during this time interval having amplitudes indicative of the severity of the fault condition associated with the PWM driver 14. In the illustrated embodiment, the value of the first reference voltage, $V_{R1}$, is set somewhere above 0.0 volts (e.g., 2.0 volts) so that when the analog output signal, $V_F$, rises sufficiently above $V_{R1}$ (e.g., ultimately to 6.45 volts as illustrated in FIG. 2) as a result of the short-to-battery fault condition associated with the PWM driver 14, comparator 32 switches states and produces a high level output voltage at $V_{SBF}$. After time T4, the fault is cleared and the PWM output voltage, $V_D$, resumes normal operation as illustrated in FIG. 2. This propagates through the various signals $V_{L1}$, $V_{S1}$, $V_{S2}$ and the analog output signal, $V_F$, accordingly returns to its non-fault state shortly after T4. When this occurs, comparator 32 again switches states and produces a low level output voltage at $V_{SBF}$. Following time T4, the PWM driver 14 operates normally.

Figure 3:
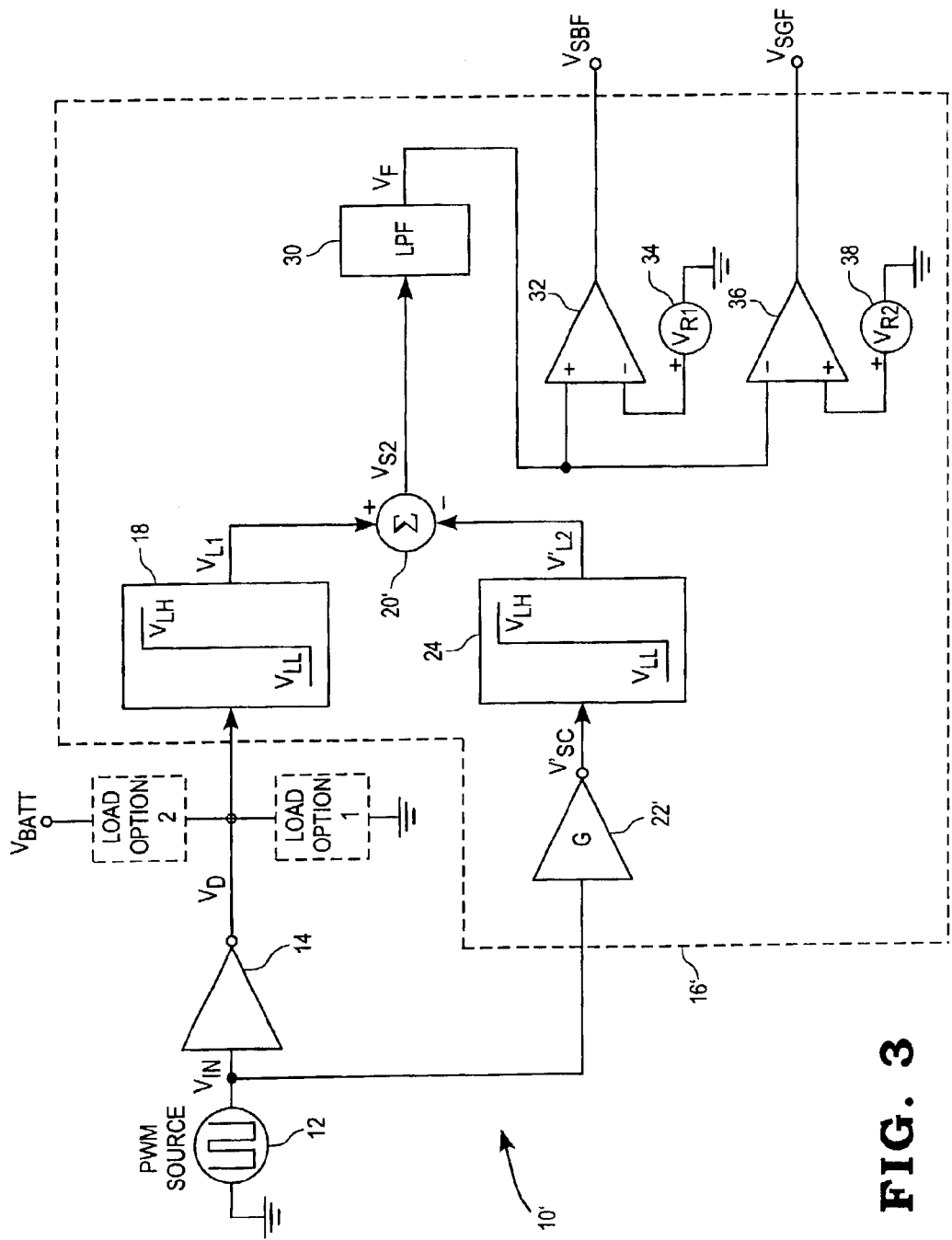
FIG. 3 is a schematic diagram of a PWM driver circuit including an alternate embodiment of an asynchronous fault detection circuit configured to detect faults associated with the conventional PWM driver illustrated in FIG. 1.

Referring now to FIG. 3, a schematic diagram of a PWM driver circuit 10' is shown including an alternate embodiment of an asynchronous fault detection circuit 16' configured to detect faults associated with the conventional PWM driver 14 illustrated in FIG. 1. Circuit 10' is identical in many respects to circuit 10 illustrated in FIG. 1, and like numbers are accordingly used to identify like components. Circuit 10' is identical to circuit 10 with respect to the PWM source 12 and PWM driver 14, but differs from circuit 10 in the structure and operation of the asynchronous fault detection circuit 16'. Specifically, the scaling circuit 22' in FIG. 3 is an inverting scaling circuit so that the scaled switching signal, $V'_{SC}$, produced by the scaling circuit 22' is a scaled and inverted representation of the PWM input signal, $V_{IN}$.

Under normal PWM driver 14 operating conditions in this embodiment, the first and second limited switching signals, $V_{L1}$ and $V_{L2}$, produced by the first and second limiter circuits 18 and 24 respectively are identical. Under PWM driver 14 fault conditions, such fault conditions will be manifested in the PWM output signal, $V_D$, produced by the PWM driver 14 and in the first limited switching signal, $V_{L1}$, produced by the limiter circuit 18 as described hereinabove. The summation circuit 20 of the fault detection circuit 16 is replaced in the fault detection circuit 16' by a subtraction circuit 20', and the signal normalizing circuitry 26 and 28 of the fault detection circuit 16 is omitted from the fault detection circuit 16'. The combined switching signal, $V_{S2}$, produced by the subtraction circuit 20' represents a difference between $V_{L1}$ and $V'_{L2}$, and is therefore identical to the combined switching signal $V_{S2}$ illustrated in FIG. 2. The remaining components of the asynchronous fault detection circuit 16' are identical in structure and function to the like numbered structural components illustrated and described with respect to the asynchronous fault detection circuit 16 of FIGS. 1 and 2.

Figure 4:
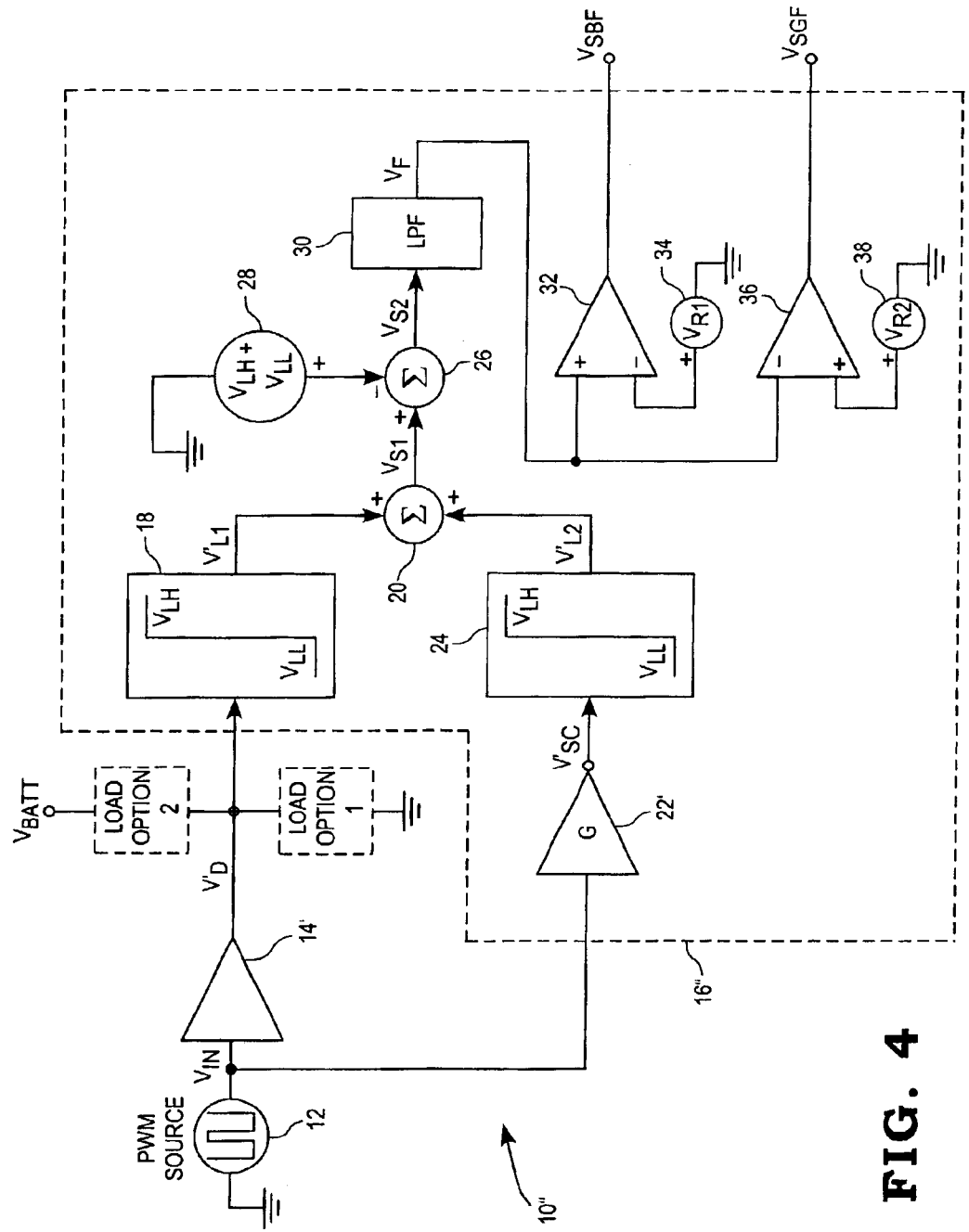
FIG. 4 is a schematic diagram of a PWM driver circuit including one embodiment of an asynchronous fault detection circuit configured to detect faults associated with another conventional PWM driver different than that illustrated in FIG. 1.

It is to be understood that the concepts described herein may also be implemented in a PWM driver circuit having a non-inverting PWM driver. Referring to FIG. 4, for example a schematic diagram of a PWM driver circuit 10" is shown including one embodiment of an asynchronous fault detection circuit 16" configured to detect faults associated with a non-inverting PWM driver 14'. Circuit 10" is identical in many respects to circuit 10 illustrated in FIG. 1, and like numbers are accordingly used to identify like components. Circuit 10' is identical to circuit 10 with respect to the PWM signal source 12, but the PWM driver 14' in this embodiment is a conventional non-inverting PWM driver producing a PWM output signal, $V'_D$, that is a non-inverted representation of the PWM input signal $V_{IN}$. The structure and operation of the asynchronous fault detection circuit 16" is accordingly modified to accommodate a non-inverting PWM driver 14'. Specifically, the scaling circuit 22' in FIG. 5 is an inverting scaling circuit so that the scaled switching signal, $V'_{SC}$, produced by the scaling circuit 22' is a scaled and inverted representation of the PWM input signal, $V_{IN}$.

Under normal PWM driver 14' operating conditions, $V'_{SC}$, is the inverse of the PWM output voltage, $V'_D$, produced by the PWM driver 14, and the first and second limited switching signals, $V'_{L1}$ and $V'_{L2}$, produced by each the limiter circuits 18 and 24 respectively will each accordingly be the inverses of the first and second limited switching signals $V_{L1}$ and $V_{L2}$ respectively illustrated in FIG. 2. The remaining components of the asynchronous fault detection circuit 16" are identical in structure and function to the like numbered structural components illustrated and described with respect to the asynchronous fault detection circuit 16 of FIGS. 1 and 2.

Figure 5:
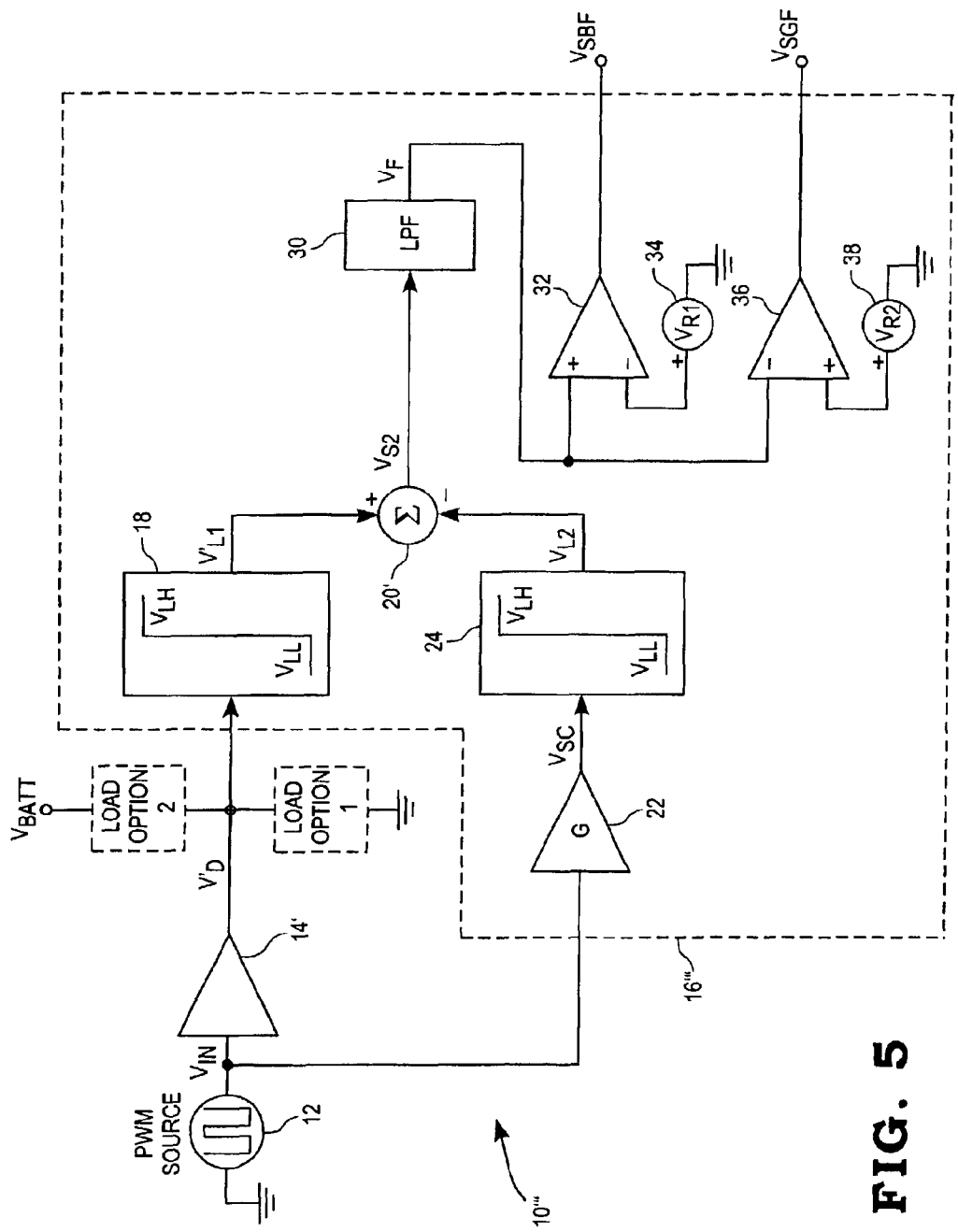
FIG. 5 is a schematic diagram of a PWM driver circuit including an alternate embodiment of an asynchronous fault detection circuit configured to detect faults associated with the conventional PWM driver illustrated in FIG. 4.

Referring now to FIG. 5, a schematic diagram of a PWM driver circuit 10''' is shown including an alternate embodiment of an asynchronous fault detection circuit 16''' configured to detect faults associated with a conventional non-inverting PWM driver 14' of the type illustrated and described with respect to FIG. 4. Circuit 10''' is identical in many respects to circuit 10 illustrated in FIG. 1, and like numbers are accordingly used to identify like components. Circuit 10''' is identical to circuit 10 with respect to the PWM source 12, but the PWM driver 14' in this embodiment is a conventional non-inverting PWM driver producing a PWM output signal, $V'_D$, that is a non-inverted representation of the PWM input signal, $V_{IN}$, as described hereinabove with respect to FIG. 4 The structure and operation of the asynchronous fault detection circuit 16''' is modified alternatively to the asynchronous fault detection circuit 16" illustrated in FIG. 4 to accommodate a non-inverting PWM driver 14' in an alternate fashion. Specifically, the first limited switching signal, $V'_{L1}$, produced by the limiter circuit 18 is, in this embodiment, a non-inverted representation of the PWM input signal, $V_{IN}$, and the second limited switching signal, $V_{L2}$, produced by the limiter circuit 24 is a non-inverted representation of the PWM input signal, $V_{IN}$, as described hereinabove with respect to FIG. 1.

Under normal PWM driver 14' operating conditions the first and second limited switching signals, $V'_{L1}$ and $V_{L2}$, produced by each the limiter circuits 18 and 24 respectively are identical. Under PWM driver 14' fault conditions, such fault conditions will be manifested in the PWM output signal, $V'_D$, produced by the PWM driver 14' and the first limited switching signal, $V'_{L1}$, produced by the limiter circuit 18 as described hereinabove, while in this embodiment these signals will be the inverses of the respective signals $V_D$ and $V_{L1}$ illustrated and described hereinabove with respect to FIGS. 1 and 2. The summation circuit 20 of the fault detection circuit 16 is thus replaced in the fault detection circuit 16''' by a subtraction circuit 20' and the signal normalizing circuitry 26 and 28 of the fault detection circuit 16 is omitted from the fault detection circuit 16'''. The combined switching signal, $V_{S2}$, produced by the subtraction circuit 20' represents a difference between $V'_{L1}$ and $V_{L2}$, and is therefore identical to the combined switching signal $V_{S2}$ illustrated in FIG. 2. The remaining components of the asynchronous fault detection circuit 16' are identical in structure and function to the like numbered structural components illustrated and described with respect to the asynchronous fault detection circuit 16 of FIGS. 1 and 2.

The asynchronous fault detection circuits 16, 16', 16" and 16''' described hereinabove and illustrated in the attached figures are configured as described to provide for the discrimination of any number of fault conditions wherein the output of the PWM driver exhibits abnormal operation with respect to its expected high and low output voltage levels. The inclusion of the limiter circuits 18 and 28 allow for detection of any number of faults wherein the low voltage level of the PWM output signal $V_D$ or $V'_D$ produced by the PWM driver 14 or 14' rises at all above the low level voltage limit $V_{LL}$ set by the limiter circuits 18 and 24, and/or wherein the high voltage level of the PWM output signal $V_D$ or $V'_D$ produced by the PWM driver 14 or 14' decreases at all below the high level voltage limit $V_{HL}$ set by the limiter circuits 18 and 24. Those skilled in the art will recognize, however, implementations of the subject asynchronous fault detection circuitry in which it is desirable to detect only fault conditions wherein the output of the PWM driver 14 or 14' is directly shorted to ground or to $V_{BATT}$. In such implementations, deviations in the high and low levels of the PWM output voltage $V_D$ or $V'_D$ from their normal values as the result of such fault conditions will be sufficiently large so that the comparator reference voltages $V_{R1}$ and $V_{R2}$ may accordingly be set substantially above or below the average value of the analog output signal, $V_F$. The analog output signal, $V_F$, in such implementations may accordingly be allowed to deviate significantly from its average value without triggering either of the comparators 32 and/or 36, and in such implementations the limiter circuits 18 and 24 of any of the asynchronous fault detection circuits 16, 16', 16", or 16''' may therefore be omitted without adversely affecting the fault detecting functions.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

What is claimed is:

1. Fault detection circuitry for a PWM driver responsive to a PWM input signal to produce a PWM output signal, the circuitry comprising:
   a first circuit configured to produce a scaled switching signal as a scaled representation of the PWM input signal;
   a second circuit configured to produce a combined switching signal as a combination of the PWM output signal and said scaled switching signal; and
   a low pass filter circuit configured to filter said combined switching signal to produce an output signal indicative of one or more fault conditions associated with the PWM driver.

2. The fault detection circuitry of claim 1 wherein said low pass filter circuit is a second-order low pass filter circuit.

3. The fault detection circuitry of claim 1 further including a comparator circuit receiving said analog output signal and producing a fault signal if said analog output signal exceeds a reference signal.

4. The fault detection circuitry of claim 3 wherein said fault signal indicates a fault condition wherein the PWM output signal is shorted to a supply voltage of the PWM driver.

5. The fault detection circuitry of claim 1 further including a comparator circuit receiving said output signal and producing a fault signal if said output signal drops below a reference signal.

6. The fault detection circuitry of claim 5 wherein said fault signal indicates a fault condition wherein the PWM output signal is shorted to a reference potential of the PWM driver.

7. The fault detection circuitry of claim 1 further including:
   a first comparator circuit receiving said signal and producing a first fault signal if said signal exceeds a first reference signal; and
   a second comparator circuit receiving said signal and producing a second fault signal if said signal drops below a second reference signal.

8. The fault detection circuitry of claim 7 wherein said first fault signal indicates a first fault condition wherein the PWM output signal is at least partially shorted to a voltage supply of the PWM driver;
   and wherein said second fault signal indicates a second fault condition wherein the PWM output signal is at least partially shorted to a reference potential of the PWM driver.

9. The fault detection circuit of claim 1 wherein said second circuit includes:
   a first limiter circuit configured to receive the PWM output signal and produce a first limited switching signal that limits a high level of the PWM output signal to a predefined high signal level and that limits a low level of the PWM output signal to a predefined low signal level; and
   a second limiter circuit receiving said scaled switching signal and producing a second limited switching signal that limits a high level of said scaled switching signal to said predefined high signal level and that limits a low level of said scaled switching signal to said predefined low signal level;
   and wherein said high level of the PWM signal and said high level of said scaled switching signal are each greater than or equal to said predefined high signal level, and the low level of the PWM signal and said low level of said scaled switching signal are each less than or equal to said predefined low signal level.

10. The fault detection circuitry of claim 9 wherein the PWM driver is an inverting driver and the PWM output signal is an inverted representation of the PWM input signal.

11. The fault detection circuitry of claim 10 wherein said first circuit is a non-inverting amplifier receiving the PWM input signal and producing said scaled switching signal as a scaled and non-inverted representation of the PWM input signal.

12. The fault detection circuitry of claim 11 wherein said second circuit includes:
   a summing circuit producing a summed switching signal as a sum of said first limited switching signal and said second limited switching signal; and a normalizing circuit producing said combined switching signal as a difference between said summed switching signal and a sum of the predefined high and low signal levels.

13. The fault detection circuitry of claim 10 wherein said first circuit is an inverting amplifier receiving the PWM input signal and producing said scaled switching signal as a scaled and inverted representation of the PWM input signal.

14. The fault detection circuitry of claim 13 wherein said second circuit includes a difference circuit producing said combined switching signal as a difference between said first limited switching signal and said second limited switching signal.

15. The fault detection circuitry of claim 9 wherein the PWM driver is a non-inverting driver and the PWM output signal is a non-inverted representation of the PWM input signal.

16. The fault detection circuitry of claim 15 wherein said first circuit is an inverting amplifier receiving the PWM input signal and producing said scaled switching signal as a scaled and inverted representation of the PWM input signal.

17. The fault detection circuitry of claim 16 wherein said second circuit includes:
   a summing circuit producing a summed switching signal as a sum of said first limited switching signal and said second limited switching signal; and
   a normalizing circuit producing said combined switching signal as a difference between said summed switching signal and a sum of the predefined high and low signal levels.

18. The fault detection circuitry of claim 15 wherein said first circuit is a non-inverting amplifier receiving the PWM input signal and producing said scaled switching signal as a scaled and non-inverted representation of the PWM input signal.

19. The fault detection circuitry of claim 18 wherein said second circuit includes a difference circuit producing said combined switching signal as a difference between said first limited switching signal and said second limited switching signal.

* * * * *